United States Patent [19]
Lewis et al.

[11] Patent Number: 5,452,324
[45] Date of Patent: Sep. 19, 1995

[54] PACKET DATA RECOVERY SYSTEM

[75] Inventors: Clarence Lewis; Khodor Elnashar, both of Richardson; Jay T. Cantrell, Dallas, all of Tex.

[73] Assignee: Texas Instruments Incorporated, Dallas, Tex.

[21] Appl. No.: 949,597

[22] Filed: Sep. 23, 1992

[51] Int. Cl.[6] .......................... H04L 7/00; H04L 25/36
[52] U.S. Cl. ..................................... 375/373; 375/359; 375/371; 327/395
[58] Field of Search .................... 328/63, 92; 307/590, 307/591, 594, 595, 597, 605; 375/110, 113, 118, 119; 327/261, 262, 394, 400, 392, 264, 393, 399, 263

[56] References Cited
U.S. PATENT DOCUMENTS

| | | | |
|---|---|---|---|
| 4,999,526 | 3/1991 | Dudley | 328/63 |
| 5,034,967 | 7/1991 | Cox et al. | 328/72 |
| 5,063,313 | 11/1991 | Kikuda et al. | 307/605 |
| 5,245,637 | 9/1993 | Gersbach et al. | 328/72 |

*Primary Examiner*—Stephen Chin
*Assistant Examiner*—William Luther
*Attorney, Agent, or Firm*—Thomas G. Eschweiler; James C. Kesterson; Richard L. Donaldson

[57] ABSTRACT

An improved data sampling system for sampling data transmission in a computer system includes a reference clock, a delay locked loop circuit, a packet enable circuit, a delayed selector control circuit, a sample selector, and a sample circuit. The devices may be constructed on a single semiconductor substrate and may be connected to a bus structure having a microcomputer and a plurality of boards coupled to it. The delay locked loop circuit generates accurate delayed clock signals based on the reference clock. A positive edge synchronizer circuit, within the delay locked loop, serves as a programmable phase adjust for the sampling system. The positive edge synchronizer ensures proper phase relationship between the chosen delayed clock signal and the incoming data across semiconductor process variations. Packet enable circuit informs the delayed control circuit and the sample circuit when a start bit or stop bit is initiated in a data packet and enables those circuit blocks accordingly. The delayed selector control circuit uses the delayed clock signals to detect a start bit on a data signal. The delayed selector control circuit employs the data signal, delayed appropriately, as a metastability hardener to eliminate potential metastability problems associated with coincident data and delay locked loop signal waveforms. The sample selector, in response to detection of the start bit by the delayed selector control circuit, selects two sampling signals from the delay locked loop circuit for even bit and odd bit sampling in the sample circuit.

10 Claims, 6 Drawing Sheets

PACKET DATA RECOVERY SYSTEM

FIELD OF THE INVENTION

This invention is in the field of computers and more specifically relates to data sampling.

BACKGROUND OF THE INVENTION

Data communication between two points always requires some method of determining when data is valid on the medium and can therefore be sampled for capture. This implies some form of synchronization between the sender and receiver of the data. The most obvious method is to transmit a synchronization signal along with the data signal to tell the receiver when to capture. This method is used extensively, especially when serial data is being transferred. This method has costs associated with extra cabling for the sync signal and extra power required in the sender. Another method involves embedding synchronization elements within the data stream itself such that the receiver can determine the optimum sampling point. In this scheme data is generally transferred in bursts, or packets, and the receiver also has to detect when a packet has begun.

The second method generally involves the use of a phase locked loop to keep the internal sampling signal in sync with the received data. Both analog and digital phase locked loops (PLL) have been used. The analog PLL modulates the phase of a clock to align it to the data. The digital PLL uses a high frequency clock and then selects which of the multiple edges of the clock that occur during one data bit time that is closest to the center. Many methods can be used with either the analog or digital PLL to notify the receiver when a new data packet has begun. One popular method is to use a distinct non-data start bit to signal the occurrence of a data packet.

Analog phase locked loop solutions are not desirable because they are prone to noise induced sampling errors. Improvements over the analog sampling technique involved the use of digital sampling approaches to avoid the noise problem. However, a problem with using digital sampling is metastability. The output of a digital latch may be indeterminate for a period of time if inputs to the latch switch concurrently. Therefore, during the time when the latch output is indeterminate, an incorrect data value may exist until the output has time to stabilize. Further improvements in digital sampling are needed.

The invention described herein uses an adaptation of the digital PLL scheme in which a string of delay buffers are used to match the data frequency. Each buffer in the string produces an edge which can be used for sampling the data, similar to the multiple edges provided by a higher frequency clock. One potential problem lies in determining the optimum sampling point by using the start bit edge to examine all the phase edges available. Since the start bit edge is inherently asynchronous with respect to the phase edges, the potential for metastability cannot be ignored. This invention uses an additional delay circuit to allow any metastability a chance to resolve itself before the sampled phase edges are propagated.

It is accordingly an object of the invention to provide a digital data sampling circuit which avoids sampling errors due to switching noise. It is a further object of the invention to provide a digital sampling circuit that is less susceptible to metastability problems.

Other objects and advantages of the invention will become apparent to those of ordinary skill in the art having reference to the following specification together with the drawings herein.

SUMMARY

An improved data sampling system for sampling data transmission in a computer system includes a reference clock, a delay locked loop circuit, a packet enable circuit, a delayed selector control circuit, a sample selector, and a sample circuit. The devices may be constructed on a single semiconductor substrate and may be connected to a bus structure having a microcomputer and a plurality of boards coupled to it. The delay locked loop circuit generates accurate delayed clock signals based on the reference clock. A positive edge synchronizer circuit, within the delay locked loop, serves as a programmable phase adjust for the sampling system. The positive edge synchronizer ensures proper phase relationship between the chosen delayed clock signal and the incoming data across semiconductor process variations. The packet enable circuit sends enable signals to sample selector and delayed selector circuit, enabling and disabling the system according to the initiation of a start bit and stop bit in the data. The delayed selector control circuit uses the delayed clock signals to detect a start bit on a data signal. The delayed selector control circuit employs the data signal, delayed appropriately, as a metastability hardener to eliminate potential metastability problems associated with coincident data and delay locked loop signal waveforms. The sample selector, in response to detection of the start bit by the delayed selector control circuit, selects two sampling signals from the delay locked loop circuit for even bit and odd bit sampling in the sample circuit.

DETAILED DESCRIPTION OF THE PREFERRED EMBODIMENT

The invention described herein uses an adaptation of the digital PLL scheme in which a string of delay buffers are used to match the data frequency. Each buffer in the string produces an edge which can be used for sampling the data, similar to the multiple edges provided by a higher frequency clock. One potential problem lies in determining the optimum sampling point by using the start bit edge to examine all the phase edges available.

Since the start bit edge is inherently asynchronous with respect to the phase edges, the potential for metastability cannot be ignored. This invention uses an additional delay circuit to allow any metastability a chance to resolve itself before the sampled phase edges are propagated.

Figure 1:
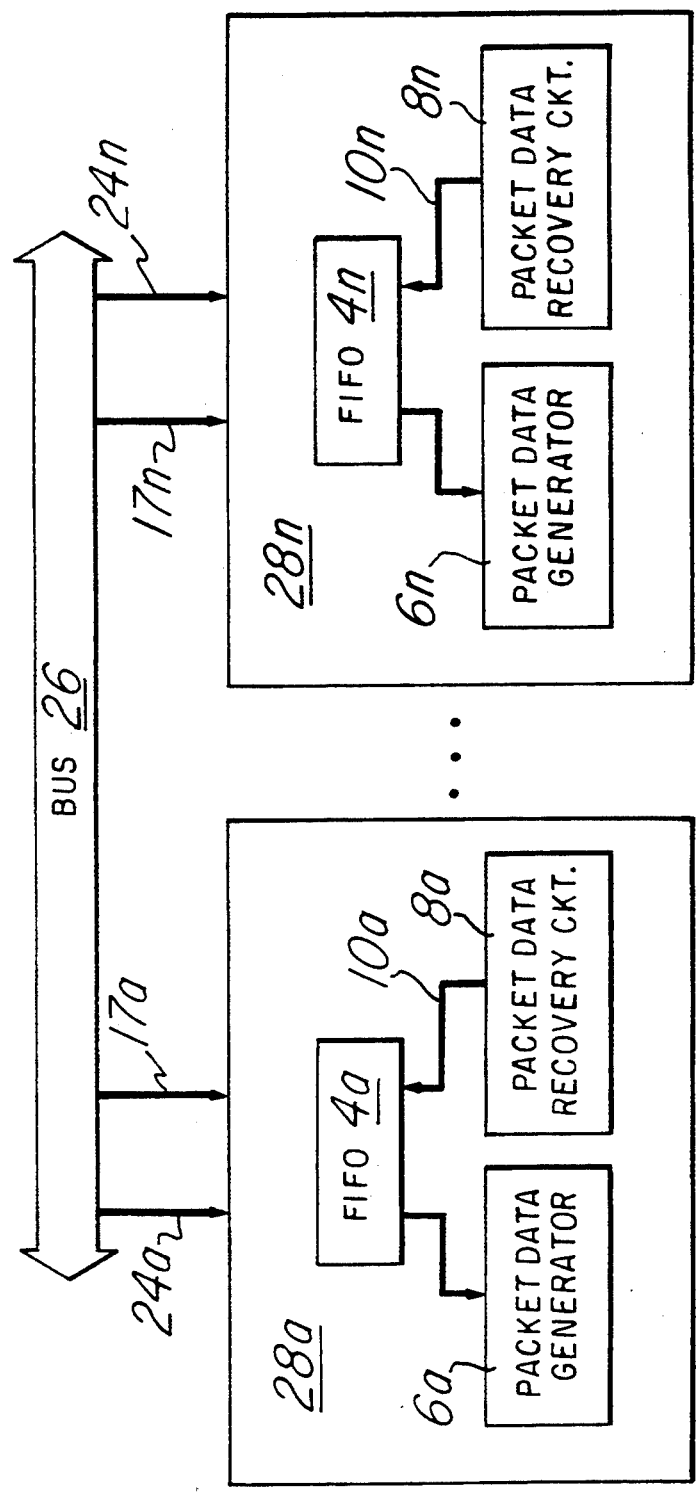
FIG. 1 is a block level system diagram illustrating a computer system.

FIG. 1 is a block diagram illustrating a computer system 11 wherein a packet data recovery circuit 8a–n is connected to a FIFO 4a–n. FIFO 4a–n is connected to a packet data generator 6a–n. These components reside on computer boards 28a–n. Additional components may reside on boards 28a–n depending upon the desired function of each board 28a–n. Boards 28a–n may include standard circuit boards such as processor boards, memory boards, input/output "I/O" boards, and graphics boards. Each board 28a–n is connected to a system bus 26 for transfer of data 24 and control information 17. Control information 17 indicates to boards 28a–n the beginning and ending of data 24 to be transferred. Bus 26 may adopt any standard bus architecture. One example is the proposed bus architecture commonly known as "Futurebus" as described in *Microprocessor Report* volume 6, number 7, May 27, 1992, page 17 et seq. Packet data recovery circuit 8a–n is connected directly to bus 26 for transfer of data 24. Packet data recovery circuit 8a–n monitors data transmissions along bus 26 to ensure accurate digital data sampling.

Figure 2:
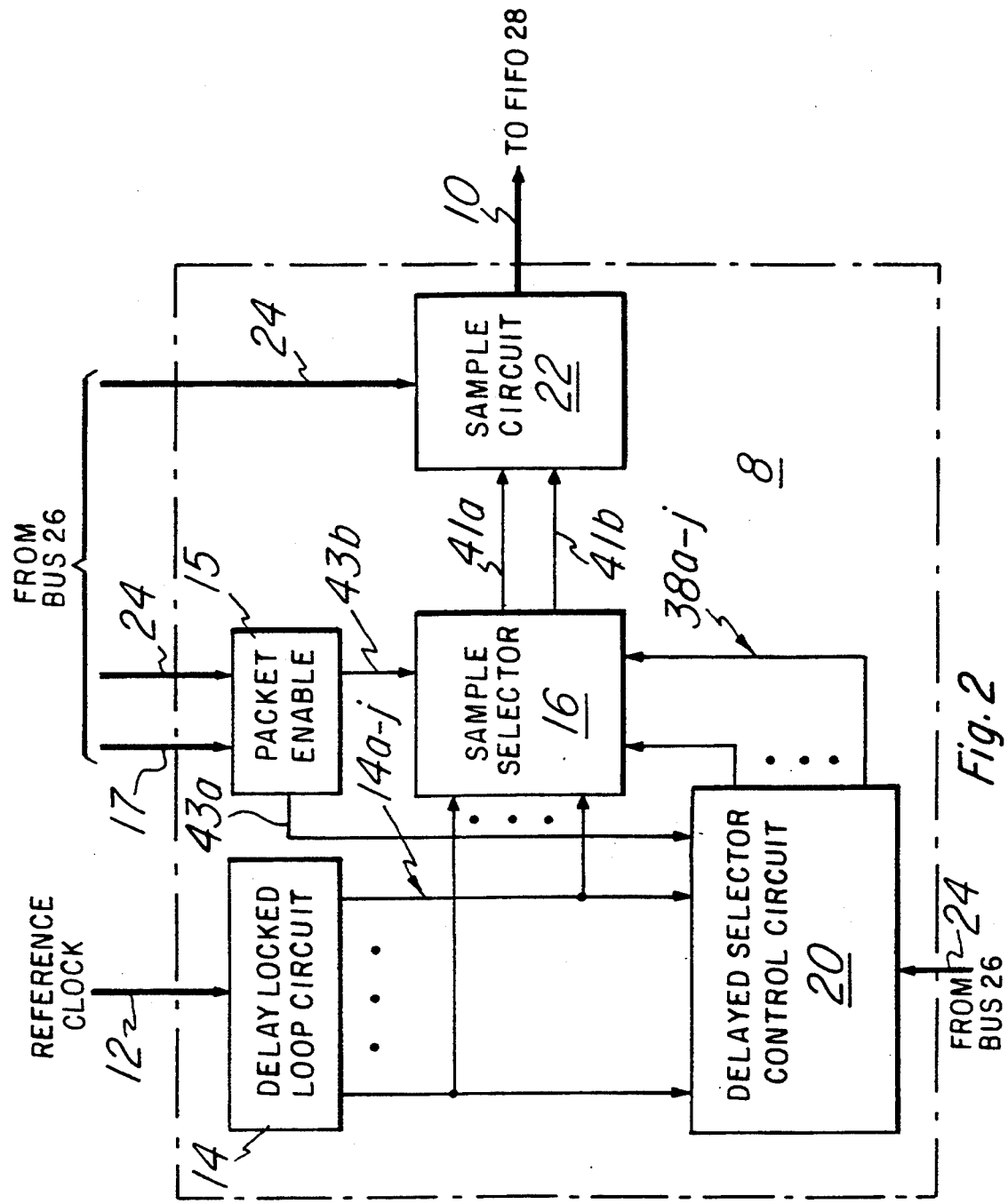
FIG. 2 is a detailed block diagram illustrating the preferred embodiment of the invention.

FIG. 2 is a block diagram illustrating packet data recovery circuit 8a in greater detail. In FIG. 2, packet data recovery circuit 8a receives as an input a reference clock signal 12 and includes a delay locked loop circuit 14, a sample selector 16, a delayed selector control circuit 20, a packet enable circuit 15, and a sample circuit 22. While illustrated in block diagram form as comprising separate circuits, of course, packet data recovery circuit 8a may be formed on a single semiconductor substrate and packaged as an integrated circuit chip. In an important aspect of the invention, packet data recovery circuit 8a resolves metastability problems associated with prior digital sampling approaches.

Reference clock signal 12 of FIG. 2 may be a signal from any conventional clock circuitry and may comprise the clock of a microprocessor. In this preferred embodiment, it operates at about 40 Mhz, thus having a period of 25 nanoseconds. The relevance of the period will be explained later. Reference clock signal 12 feeds delay locked loop circuit 14. Delay locked loop circuit 14 produces a plurality of outputs 14a–j (incrementally delayed clock signals) which are inputs to both sample selector 16 and delayed selector control circuit 20. Delayed selector control circuit 20 also has a plurality of outputs 38a–j that serves as additional inputs to sample selector 16. Packet enable circuit 15 receives data 24 and control information 17 and outputs an enable signal 43a to delayed selector control circuit 20 and an enable signal 43b to sample selector 16. Sample selector 16 has an output 41 that is composed of two signals 41a and 41b that feed a sample circuit 22. Sample circuit 22 receives signals 41a and 41b and data 24 and uses signals 41a and 41b to accurately sample data 24. Sampled data 10 is output from sample circuit 22 and sent to FIFO 28.

Figure 3:
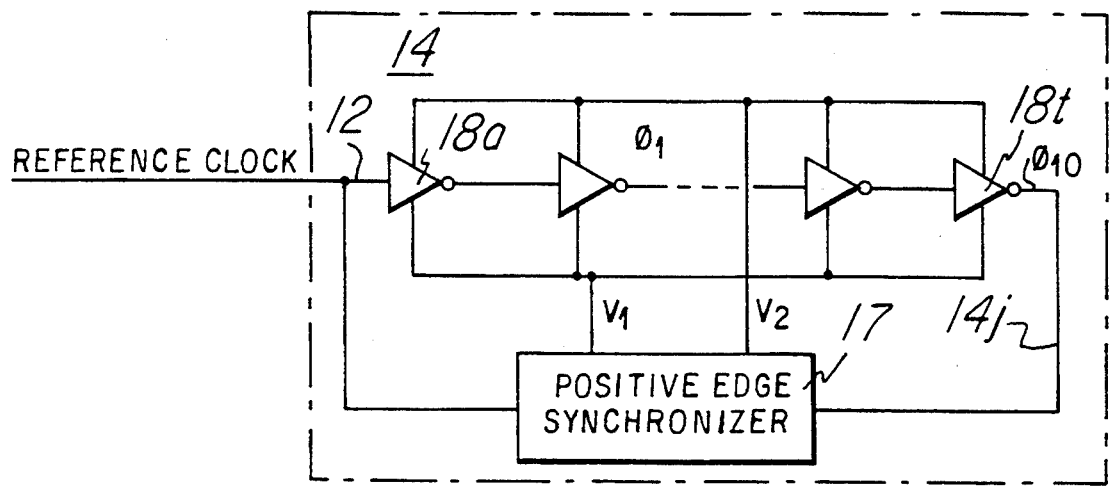
FIG. 3 is a combined gate level and block level diagram illustrating a delay locked loop circuit 14 in FIG. 2.
Figure 3A:
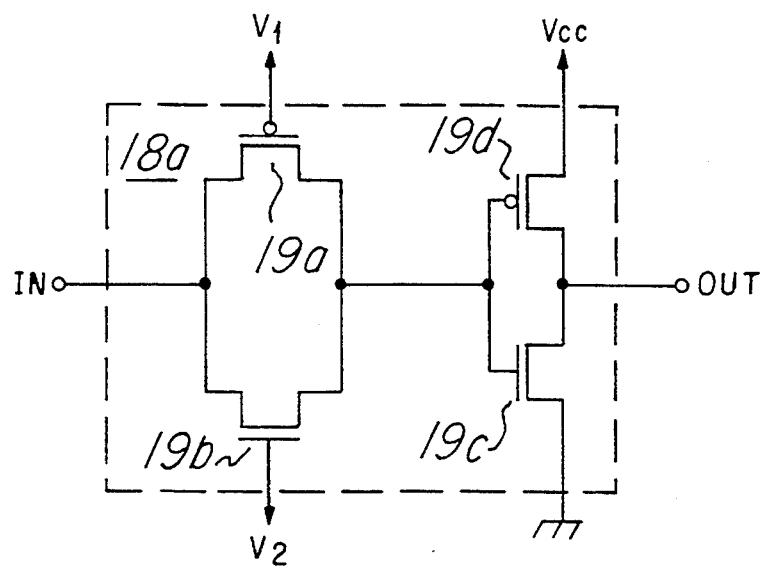
FIG. 3a is a circuit diagram illustrating a transistor level implementation of an inverting delay element 18 in FIG. 3.

FIGS. 3 and 3a illustrate delay locked loop circuit 14 in greater detail. FIG. 3 is a combined block diagram and schematic diagram illustrating a plurality of invertor elements 18a–t connected to a positive edge synchronizer 17 within delay locked loop circuit 14. Invertors 18a–t connected in series form buffers chosen to match the period of clock signal 12. In this example, with clock signal 12 having a period of 25 nanoseconds, ten delay buffer elements (and therefore twenty invertors 18a–t) of 2.5 nanoseconds delay each form delay locked loop circuit 14. Clock signal 12 and an output of the last delay buffer 14j form inputs to positive edge synchronizer 17. Positive edge synchronizer 17 takes inputs 12 and 14j and compares them to see whether they are in phase. Positive edge synchronizer 17 then adjusts programmable analog voltage sources $V_1$ and $V_2$ to either increase or decrease the propagation delay of clock signal 12 through invertors 18a–t so that signals 12 and 14j remain in phase with one another. In this manner, positive edge synchronizer 17 provides compensation to maintain appropriate phase relationship in delay locked loop circuit 14 independent of process or supply variations.

FIG. 3a is a circuit diagram illustrating internal circuit components that comprise invertor element 18a of FIG. 3. Invertor 18a includes four MOS (metal oxide semiconductor) transistors; two NMOS transistors and two PMOS transistors. PMOS transistor 19a and NMOS transistor 19b form a complimentary MOS transmission gate. Their source/drain terminals are connected together such that the two transistors 19a and 19b are in parallel. The gate of PMOS transistor 19a is connected to a programmable analog voltage source V1 while the gate of NMOS transistor 19b is connected to a programmable analog voltage source V2. Series connected PMOS transistor 19c and NMOS transistor 19d form a complimentary MOS invertor. PMOS transistor 19c source is biased at a voltage supply Vcc while the source of NMOS transistor 19d is connected to ground. The output of the transmission gate is connected to the gates of transistors 19c and 19d.

Figure 3B:
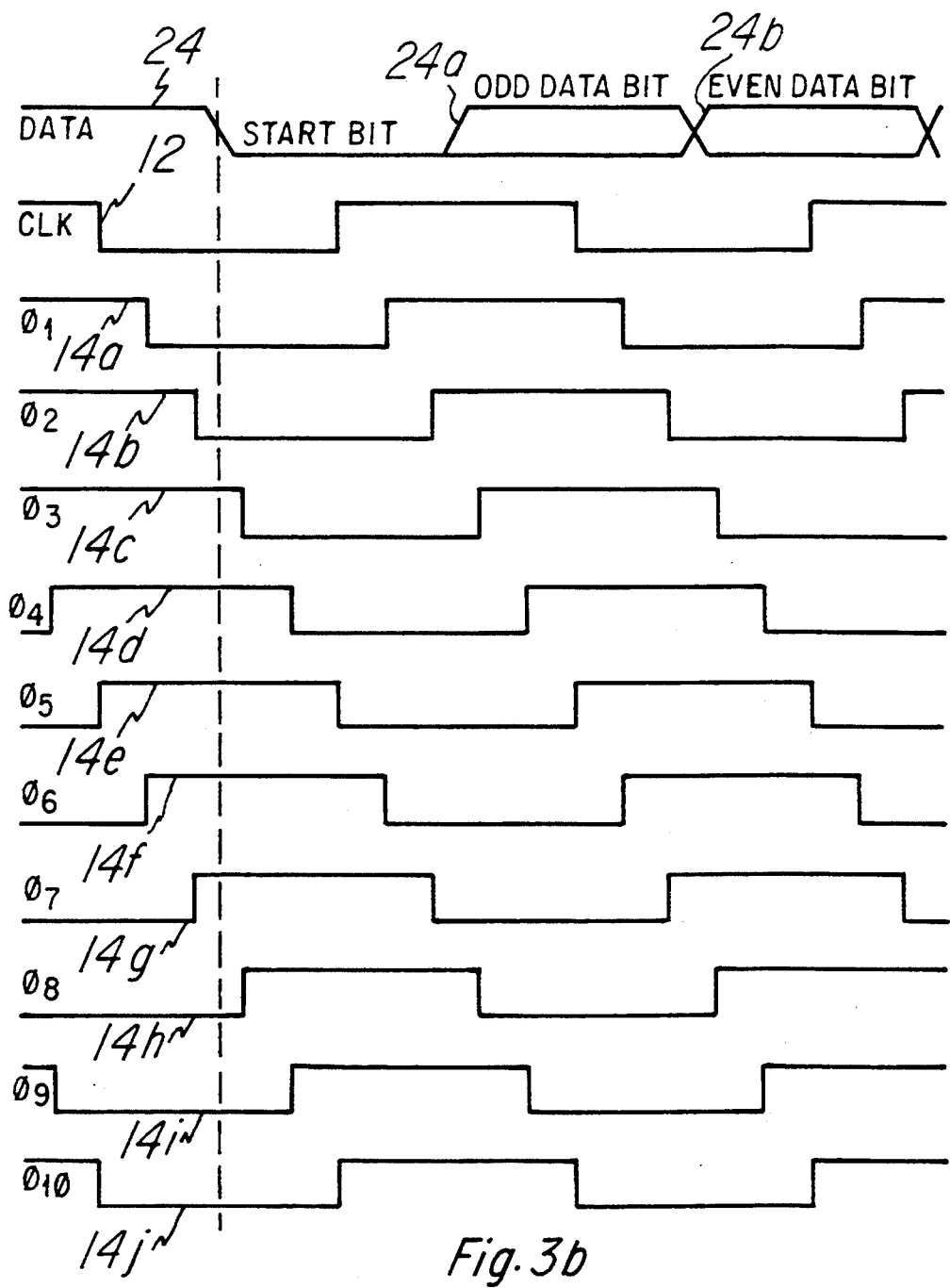
FIG. 3b is a timing diagram illustrating a plurality of delayed clock signals 14a–j generated by delay locked loop circuit 14 of FIG. 2.

FIG. 3b is a timing diagram illustrating data signal 24, clock signal 12, and ten phase delayed signals 14a–j that are delayed with respect to clock signal 12 and serve as outputs of delay locked loop 14. Data signal 24, clock signal 12 and phase delayed signals 14a–j are all synchronous. Phase delayed signals 14a–j are latched by data signal 24 when data 24 initiates its start bit via a high-to-low transition to determine an appropriate delay signal edge 14a–j to use for sampling data 24 accurately. This feature will be discussed later in more detail in the functional description of FIG. 4 and FIG. 5.

Figure 4:
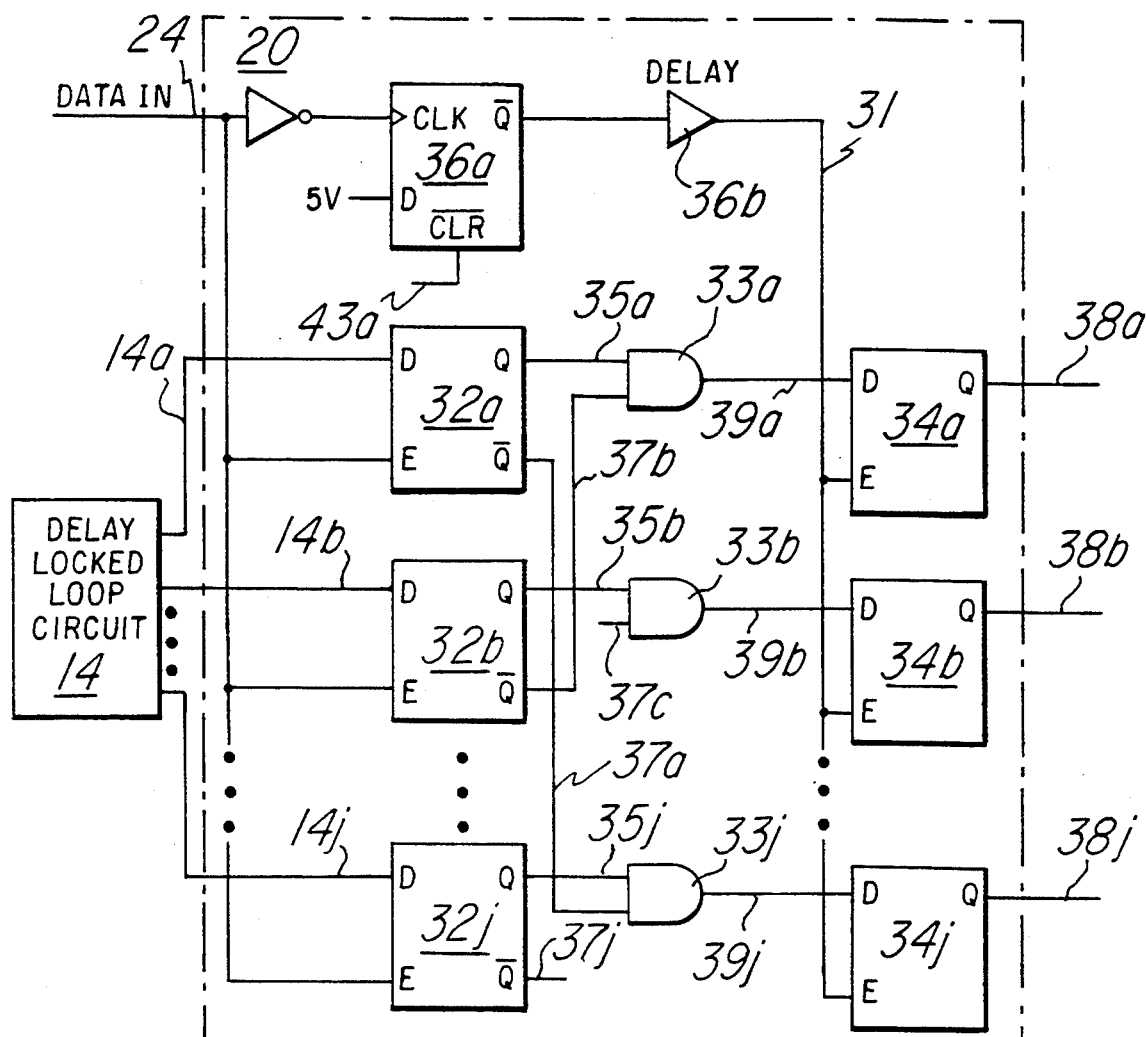
FIG. 4 is a schematic diagram illustrating a delayed selector control circuit 20 in FIG. 2 and the metastability timeout feature.

FIG. 4 is a schematic diagram illustrating in greater detail delayed selector control circuit 20 of FIG. 2. Delayed selector control circuit 20 includes two groups of latches 32a–j and 34a–j together with delay element 36 which includes a flip-flop 36a and a delay buffer 36b and a plurality of dual-input AND gates 33a–j. Latches 32a–j and 34a–j are preferably simple D-type latches having a data input D, an enable input E, and two outputs, Q and Qnot. The Qnot output is not utilized in latches 34a–j. Delay locked loop signals 14a–j are input to corresponding D inputs of latches 32a–j. Data 24 from bus 26 forms the connection to the enable inputs of latches 32a–j. Q outputs 35a–j of latches 32a–j are inputs to dual-input AND gates 33a–j. Qnot outputs 37a–j form the second input to AND gates 33a–j wherein output 37b is an input to AND gate 33a and output 37c is an input to AND gate 33b and so on. Data 24 from bus 26, delayed by delay element 36, forms the connection to the enable inputs of latches 34a–j.

Figure 5:
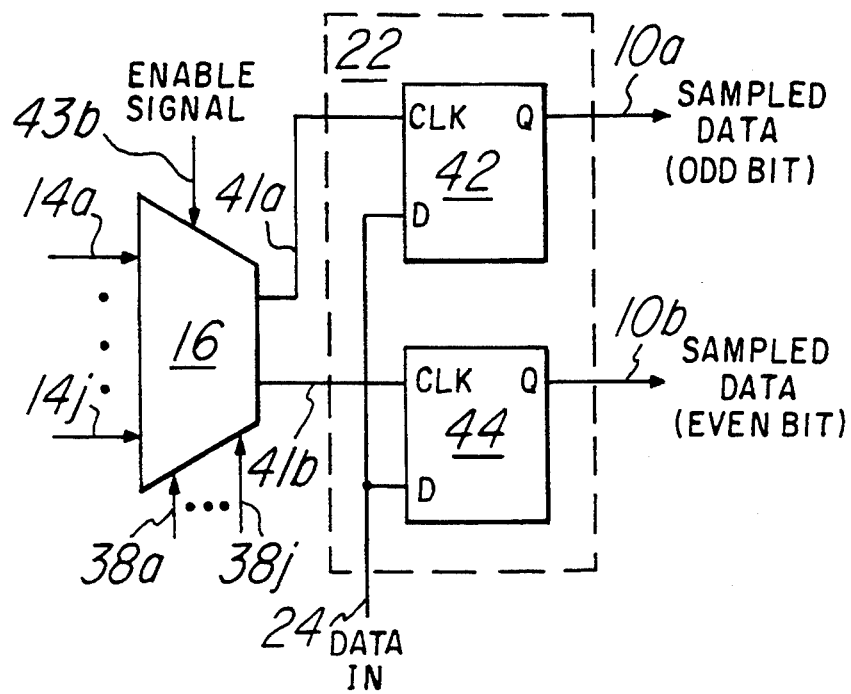
FIG. 5 is a schematic diagram illustrating a sample selector 16 and a sample circuit 22 in FIG. 2.

FIG. 5 is a schematic diagram illustrating the components that comprise sample selector 16 and sample circuit 22 of FIG. 2. Sample selector 16 is a multiplexer which selects two phase signals from phase delayed signals 14a–j as indicated in Table 1. Sample circuit 22 consists of flip flops 42 and 44. The Q outputs 38a–j of latches 34a–j from delayed selector control circuit 20 of FIG. 4 form control inputs to sample selector 16. Phase delayed signals 14a–j from delay locked loop 14 also form inputs to sample selector 16. The outputs of sample selector 16 form the clock inputs to flip flops 42 and 44. Data 24 from bus 26 form the data inputs to flip flops 42 and 44. Sample selector 16 enables flip flops 42 and 44 for data sampling dependent upon the binary values of signals 38a–j. The Q output of flip flop 42 provides odd bit sampled data 10a while the Q output of flip flop 44 provides even bit sampled data 10b as explained below. The output of sample circuit 22 represent sampled data signal 10 of FIG. 2. Table 1 below illustrates the appropriate phase delayed signals 14a–j from FIG. 3b forming phases 1–10 that sample selector 16 specifies for use in enabling flip flops 42 and 44 of sample circuit 22 for data sampling dependent upon the binary code of input signals 38a–j at the instant start bit 24 is initiated.

TABLE 1

| Enable Sig. 43b | Binary Code 38a-j | Start Bit Init. Between | Odd Sample Signal 41a | Even Sample Signal 41b |
| --- | --- | --- | --- | --- |
| 1 | 1000000000 | Φ1 & Φ2 | Φ9 (14i) | Φ4 (14d) |
| 1 | 0100000000 | Φ2 & Φ3 | Φ10 (14j) | Φ5 (14e) |
| 1 | 0010000000 | Φ3 & Φ4 | Φ1 (14a) | Φ6 (14f) |
| 1 | 0001000000 | Φ4 & Φ5 | Φ2 (14b) | Φ7 (14g) |
| 1 | 0000100000 | Φ5 & Φ6 | Φ3 (14c) | Φ8 (14h) |
| 1 | 0000010000 | Φ6 & Φ7 | Φ4 (14d) | Φ9 (14i) |
| 1 | 0000001000 | Φ7 & Φ8 | Φ5 (14e) | Φ10 (14j) |
| 1 | 0000000100 | Φ8 & Φ9 | Φ6 (14f) | Φ1 (14a) |
| 1 | 0000000010 | Φ9 & Φ10 | Φ7 (14g) | Φ2 (14b) |
| 1 | 0000000001 | Φ10 & Φ1 | Φ8 (14h) | Φ3 (14c) |
| 0 | Don't Care | Don't Care | Low (0) | Low (0) |

To facilitate understanding the operation of data packet recovery system 11, the operation of delay locked loop circuit 14 of FIG. 2 is first discussed.

Delay locked loop circuitry 14 of FIG. 2 provides ten output signals 14a–j each incrementally out of phase with one another and out of phase with the clock signal 12 as shown in FIG. 3b. PMOS transistor 19a and NMOS transistor 19b of FIG. 3a comprise a programmable CMOS transmission gate. Two distinct, programmable analog voltage sources, V1 and V2, drive the gates of transistors 19a and 19b. When V1 and V2 are at a low voltage, transistor 19a is conducting and transistor 19b is not conducting. At this time the CMOS transmission gate has an associated "on-resistance" that can be measured in OHMS. When V1 and V2 are both at a high voltage, transistor 19a is not conducting and transistor 19b is conducting and the CMOS transmission gate has an "on-resistance" similar to the case described above. However, if V1 and V2 are allowed to operate independently of one another, (as is the case in this particular embodiment) then transistors 19a and 19b may both be either conducting or nonconducting independently of one another. Further, transistors 19a and 19b, may each be controlled to conduct at varying levels of conductivity through the manipulation of gate voltages V1 and V2. Therefore, the CMOS transmission gate, composed of transistors 19a and 19b, may behave as a programmable, variable resistor.

PMOS transistor 19c and NMOS transistor 19d of FIG. 3a comprise a CMOS invertor. Transistors 19c and 19d invert the input signal, place the inverted signal on the output, and provide a constant capacitance composed of the gate-to-source capacitance associated with NMOS transistor 19d. Therefore, through coupling two CMOS transmission gate and CMOS invertor pairs together, a buffer circuit with a programmable "RC" time constant is provided thereby providing the ability to manipulate the speed of signal transmission through the buffer circuit via manipulation of programmable analog voltage sources V1 and V2.

Delay locked loop circuit 14, of FIG. 2, provides twenty invertors, (and therefore ten buffers) each delayed from one another by about 1.25 nanoseconds. Therefore, the output of delayed locked loop 14 is delayed from input clock signal 12 by 25 nanoseconds. Since clock 12, in this embodiment, operates at a frequency of 40Mhz, its period is 25 nanoseconds and clock signal 12 and the last output 14j (Φ10) of delay locked loop circuit 14 will be in phase with one another.

A functional description of the packet data recovery system according to the invention is now provided. In general, packet data recovery system 8a of FIG. 2 provides accurate, efficient data sampling by using a programmable delay locked loop circuit 14 that adjusts itself automatically over process and supply variations to remain in phase with reference clock 12. The data sampling incorporates a metastability hardener, via delayed selector control circuit 20, that ensures that the correct data is being sampled in the event of the falling edge of data signal 24 being coincident with one of the rising edges of phase delayed signals 14a–j during data sampling.

As discussed above, reference clock signal 12 and delay locked loop circuit 14 provide ten output signals 14a–j each incrementally out of phase with one another. Positive edge synchronizer 17 assures the last output 14j (Φ10) of delay locked loop circuit 14 remains in phase with clock signal 12 independently of process or supply variations. Positive edge synchronizer 17 compares the last output 14j (Φ10) of delay locked loop circuit 14 and clock signal 12 to ensure that the signals are in phase with one another. If they are not in phase with one another, positive edge synchronizer 17 drives programmable analog voltage sources V1 and V2, described with reference to FIGS. 3 and 3a above, to increase or decrease the signal transmission speed through delay locked loop circuit 14 appropriately to maintain the proper phase relationship between clock signal 12 and the last output 14j of delay locked loop circuit 14.

Delayed selector circuit 20, illustrated in detail in FIG. 4, takes phase delayed signals 14a–j from delay locked loop 14, enable signal 43a form packet enable circuit 15, and data signal 24 and outputs ten binary outputs 38a–j to sample circuit 22. Enable signal 43a clears flip flop 36a following reset or receipt of a stop bit in data 24 prior to the receipt of the next start bit. This prepares delayed selector control circuit 20 for capturing the next start bit phase information. As earlier explained, delayed selector circuit 20 comprises two series of ten latches, 32a–j and 34a–j, dual-input AND gates 33a–j, and a delay mechanism 36. Each latch 32a–j has a control signal input (a latch enable) which is coupled to data signal 24. Therefore, as data signal 24 transitions from high-to-low, inputs to latches 32a–j are disabled and phase delayed inputs 14a–j, at that instant, are held, forming Q outputs 35a–j of latches 32a–j. Q outputs 35a–j from latches 32a–j are input into dual-input AND gates 33a–j. AND gates 33a–j ensure that only one input to latches 34a–j will have a binary value of "1" by inputting the next latch's Qnot output as the second input. Therefore, if output 35a is a "1" and output 35b is a "0", 39a will be a "1". In any other case (35a="1" and 35b="1", or 35a="0" and 35b="1", or 35a="0" and 35b="0") output 39a will have a binary value of "0". Therefore, signals 39a–j will always be a ten digit binary code with only one digit having the binary value of "1". This code 39a–j indicates when start bit 24 is initiated. The control input signal (latch enable) for each latch 34a–j is the detection of the first high-to-low transition of data signal 24 delayed by delay mechanism 36. Delay mechanism 36 comprises a flip flop 36a and a series of six invertors (shown as buffer element 36b) similar to the invertors described in FIG. 3 and FIG. 3a. Therefore, control input signal 31 for latches 34a–j are delayed 7.5 nanoseconds (6 invertors×1.25nS delay/invertor) from control input signal 24 for latches 32a–j. Signals 39a–j, which represent the binary code described earlier gets latched into a series of D-type latches, 34a–j, 7.5 nanoseconds after data signal 24 disabled latches 32a–j. Signals 39a–j are then held and become outputs 38a–j. Delayed selector control circuit 20 outputs binary code 38a–j to sample selector 16. Binary code 38a–j, when decoded by sample selector 16, indicates what phase delayed signals 14a–j should be used to accurately sample even and odd bits of data signal 24.

Delayed selector control circuit 20 acts as a metastability hardener through the addition of latches 34a–j and delay mechanism 36. In the event that the falling edge of data signal 24 (the start bit) is coincident with an edge of one of phase delayed signals 14a–j (inputs to the first series of latches 32a–j), one of outputs 35a–j (and therefore 39a–j) will be indeterminate for a short period of time, after which the output in question will recover from the metastable condition and hold the proper, accurate data. Delay mechanism 36 delays data signal 24 by 7.5 nanoseconds and therefore latches the proper value, after the potentially questionable output has recovered, onto latch outputs 38a–j.

Sample selector 16, illustrated in detail in FIG. 5, takes binary code 38a–j and phase delayed signals 14a–j, and enable signal 43b and determines what phase delayed signal 14a–j to use for sampling the odd data bits and what phase delayed signal, 14a–j, to use for sampling the even data bits. Sample selector 16 generates odd and even sample clocks based on the occurrence of the start bit transition. The truth table of sample selector 16 is shown in Table 1.

FIG. 3b timing diagram shows this more clearly. As data signal 24 transitions from high-to-low it indicates the start bit and the enable input of latches 32a–j of FIG. 4 latch their inputs. Enable input 31 cause the latches to latch their data 34a–j approximately 7.5 ns later. The outputs 38a–j of latches 34a–j hold the following information according to the example illustrated in FIG. 3b : 38a ="0" (Φ1), 38b="0" (Φ2), 38c="0" (Φ3), 38d="0" (Φ4), 38e="0" (Φ5), 38f="0" (Φ6), 38g="1" (Φ7), 38h="0" (Φ8), 38i="0" (Φ9), 38j="0" (Φ10). This represents the following binary code: 0000001000. This code indicates that the transition of data signal 24 from high-to-low occurred between 14g and 14h which represents Φ7 and Φ8 signals. With this information, sample selector 16 determines what phase delayed signal 14a–j to use to sample odd data bits 24a and what delayed phase signal 14a–j to use to sample even data bits 24b.

Referring to FIG. 5, binary values 38a–j and enable signal 43b are inputs to sample selector 16. Sample selector 16, when enabled, takes binary code 38a–j, and determines which phase delayed signal 14a–j should be used to sample odd data bits 24a and even data bits 24b according to the truth table illustrated in Table 1. If sample selector 16 is disabled, it outputs a "0". The outputs of sample selector 16, therefore, are two separate phase delayed signals 41a and 41b, according to Table 1, that serve as the enable input signals for flip flops 42 and 44 in sample circuit 22. The data input for flip flops 42 and 44 is data signal 24. Using the example of FIG. 3c, when the start bit goes from the high-to-low transition between delayed phase signal Φ7, 14g, and delayed phase signal Φ8, 14h, sample selector 16 determines that the clock input for flip flop 42 (the odd bit sample latch) will be phase delayed signal Φ5, 14e, and the clock input for flip flop 44 (the even bit sample latch) will be phase delayed signal Φ10, 14j. (Note that flip flops 42 and 44 are clocked by the rising edge of phase delayed signals, 14e and 14j. This places each sample point half-way between the transition points of incoming data 24.

Sample circuit 22 thus outputs the accurately sampled data (both odd data bits 10a and even data bits 10b) to FIFO 4a.

Although the invention has been described with reference to the preferred embodiment herein, this description is not to be construed in a limiting sense. Various modifications of the disclosed embodiment will become apparent to persons skilled in the art upon reference to the description of the invention. It is therefore contemplated that the appended claims will cover any such modifications or embodiments as fall within the true scope of the invention.

What is claimed is:

1. A method of providing a delayed signal with respect to a reference signal that maintains a constant time delay independently of temperature or process variation, comprising the steps of:

forming a CMOS transmission gate comprising an NMOS transistor and a PMOS transistor wherein the source of the NMOS transistor is coupled to the source of the PMOS transistor and form an input for the CMOS transmission gate and the drain of the NMOS transistor is coupled to the drain of the PMOS transistor and form an output for the CMOS transmission gate;

coupling a first variable voltage source to the gate of the NMOS transistor such that the first variable voltage source may vary the conductivity of the PMOS transistor;

coupling a second variable voltage source to the gate of the PMOS transistor such that the second variable voltage source may vary the conductivity of the PMOS transistor;

forming a CMOS invertor comprising a PMOS transistor and an NMOS transistor connected in series wherein a drain of the PMOS transistor is connected to a first fixed voltage source and a source of the NMOS transistor is connected to a second fixed voltage source wherein the first fixed voltage source is a larger voltage than the second fixed voltage source and the drain of the NMOS transistor is coupled to the drain of the PMOS transistor and form an output for the CMOS invertor and the gate of the NMOS transistor is coupled to the gate of the PMOS transistor and form an input for the CMOS invertor; and coupling the output of the CMOS transmission gate to the input of the CMOS invertor such that CMOS transmission gate serves as a variable resistor through manipulation of the first variable voltage source and the second variable voltage source and the CMOS invertor serves as a constant capacitance formed by a gate-to-source junction in the NMOS transistor such that a programmable "RC" time constant allows adjustments in signal transmission speed.

2. A data sampling system, comprising:

a delay locked loop circuit driven by a reference signal, whereby a plurality of incrementally delayed phase signals are produced;

a delayed selector control circuit connected to the delay locked loop circuit, wherein the delayed selector control circuit latches the plurality of incrementally delayed phase signals when a data transfer is initiated and identifies between which incrementally delayed phase signals the data transfer initiation occurred and creates a binary code in response to the identification;

a sample selector connected to the delay locked loop circuit and the delayed selector control circuit, wherein the sample selector receives the binary code from the delayed selector control circuits and selects at least one of the plurality of incrementally delayed phase signals as sampling signals;

a packet enable circuit connected to the delayed selector control circuit and the sample selector circuit wherein the packet enable circuit informs the delayed selector control circuit and the sample circuit when a data transfer is initiated or terminated;

a sample circuit connected to the sample selector, wherein the sample circuit receives the sampling signals from the sample selector and samples data during the data transfer.

3. The system of claim 2 wherein the delay locked loop circuit comprises a plurality of buffer circuits to provide signal delay.

4. The system of claim 3 wherein the plurality of buffer circuits each comprise two invertor circuits connected together in series, each invertor further comprising:

a first PMOS transistor;

a first NMOS transistor connected in parallel with the first PMOS transistor forming a transmission gate, the sources of the first NMOS transistor and the first PMOS transistor being connected together and forming an input to the invertor circuit and the drains of the first NMOS transistor and the first PMOS transistor connected together and forming an output to the transmission gate;

a second PMOS transistor with a source connected to a fixed supply voltage, and a gate connected to the output of the CMOS transmission gate; and a second NMOS transistor with a source connected to ground potential, a gate connected to the output of the transmission gate, and a drain connected to a drain of the second PMOS transistor and forming an output of the invertor circuit.

5. The system of claim 2 wherein the delayed selector control circuit comprises:

a first plurality of D-type latches each with two inputs, a data input and a latch enable input, and one output, wherein each of the plurality of data inputs are coupled to one of the plurality of phased delayed signals produced by the delay locked loop circuit and the plurality of latch enable inputs are coupled to the data signal;

a plurality of AND gates with two inputs and one output, wherein one input is connected to a "Q" output of a first of the first plurality of D-type latches and a second input is connected to a "Qnot" output of a second of the first plurality of D-type latches and the second of the first plurality of D-type latches is the next incremental latch in the first plurality of D-type latches;

a second plurality of D-type latches each with two inputs, a data input and a latch enable input, and one output, wherein the data inputs of the second plurality of D-type latches are connected to the respective outputs of the plurality of AND gates, the latch enable inputs are connected to the data signal, and the outputs of the second plurality of D-type latches represent a binary code that indicates which incrementally phase delayed signals should be used to sample the data signal; and a delay mechanism coupled between the latch enable inputs of the first plurality of D-type latches and the latch enable inputs of the second plurality of D-type latches such that the latch enable inputs of the second plurality of D-type latches enable the second plurality of D-type latches at a later time than the enabling of the first plurality of D-type latches.

6. The system of claim 5 wherein the delay mechanism comprises a plurality of signal delay buffer circuits and a latch.

7. The system of claim 2 wherein the sample circuit comprises:

two flip flops, each with two inputs, a data input and an enable input, and an output, wherein the first flip flop has the enable input connected to the first output of the logic control circuit and the second flip flop has the enable input connected to the second output of the logic control circuit and the second input of the first flip flop and the second flip flop latch are connected to the bus, and the output of the first flip flop holds odd bit sample data from the bus and the output of the second flip flop holds even bit sampled data from the bus.

8. The system of claim 2 wherein the sample selector comprises:

a multiplexer, wherein the multiplexer takes inputs from the delay locked loop circuit and the delayed selector control circuit and outputs two of the incrementally phase delayed signals to the sample circuit.

9. A programmable signal delay circuit with an input and an output, comprising:

a first NMOS transistor with a source connected to the input, a gate connected to a first variable voltage source, and a drain;

a first PMOS transistor with a source connected to the input, a gate connected to a second variable voltage source, and a drain connected to the drain of the first NMOS transistor;

a second NMOS transistor with a gate connected to the drain of the first PMOS transistor, a source connected to circuit ground, and a drain connected to the output; and a second PMOS transistor with a gate connected to the gate of the second NMOS transistor, a source connected to a fixed voltage source, and a drain connected to the output.

10. The programmable signal delay circuit of claim 9 wherein the first variable voltage source and the second variable voltage source operate independently of one another and provide the first NMOS transistor and the first PMOS transistor to conduct at varying conductivities such that the combination of the first NMOS transistor and the first PMOS transistor behave as a programmable, variable resistor.

* * * * *